(12) United States Patent
Teranishi et al.

(10) Patent No.: US 10,120,002 B2
(45) Date of Patent: Nov. 6, 2018

(54) ESTIMATION PROGRAM, ESTIMATION APPARATUS, AND ESTIMATION METHOD

(71) Applicant: FUJITSU LIMITED, Kawasaki-shi, Kanagawa (JP)

(72) Inventors: Yuta Teranishi, Kawasaki (JP); Hironobu Kitajima, Kawasaki (JP); Hideyuki Kikuchi, Chigasaki (JP)

(73) Assignee: FUJITSU LIMITED, Kawasaki (JP)

( * ) Notice: Subject to any disclaimer, the term of this patent is extended or adjusted under 35 U.S.C. 154(b) by 914 days.

(21) Appl. No.: 14/520,778

(22) Filed: Oct. 22, 2014

(65) Prior Publication Data
US 2015/0112616 A1 Apr. 23, 2015

(30) Foreign Application Priority Data
Oct. 23, 2013 (JP) .................. 2013-220446

(51) Int. Cl.
*G01R 21/00* (2006.01)
*G01R 21/133* (2006.01)
*G06Q 50/06* (2012.01)
*G06Q 10/04* (2012.01)
*G06Q 30/02* (2012.01)

(52) U.S. Cl.
CPC .......... *G01R 21/133* (2013.01); *G06Q 10/04* (2013.01); *G06Q 30/0204* (2013.01); *G06Q 50/06* (2013.01); *Y04S 50/14* (2013.01)

(58) Field of Classification Search
CPC ...... G01R 21/00; G01R 21/133; G06Q 50/06; G06Q 30/0204; G06Q 10/04; Y04S 50/14
USPC ........................................................ 702/60
See application file for complete search history.

(56) References Cited

U.S. PATENT DOCUMENTS

2011/0004421 A1* 1/2011 Rosewell .............. G01D 4/002
702/45

FOREIGN PATENT DOCUMENTS

| JP | 2004-320963 | | 11/2004 |
|---|---|---|---|
| JP | 2004320963 | A * | 11/2004 |
| JP | 2005-57821 | | 3/2005 |
| JP | 2006011715 | A * | 1/2006 |
| JP | 2006-217742 | | 8/2006 |
| JP | 2006-333687 | | 12/2006 |
| JP | 2007-82346 | | 3/2007 |

(Continued)

OTHER PUBLICATIONS

Japanese Office Action dated Jan. 31, 2017 in corresponding Japanese Patent Application No. 2013-220446.

*Primary Examiner* — Stephanie Bloss
(74) *Attorney, Agent, or Firm* — Staas & Halsey LLP

(57) ABSTRACT

A non-transitory computer readable storage medium for causing a computer monitoring a power distribution system in which a first customer and a second customer are mixed to execute a process, the process including: acquiring first data measured with a first measurement device which is installed in the first customer and measures the first data at a first time interval; acquiring second data measured with a second measurement device which is installed in the second customer and measures the second data at a second time interval longer than the first time interval; estimating data of the first time interval about an electric power of the second customer by using the acquired first data and the acquired second data; and estimating a value about a voltage or a current for each customer by using the estimated data of the first time interval and the acquired first data.

6 Claims, 12 Drawing Sheets

(56) References Cited

FOREIGN PATENT DOCUMENTS

| | | |
|---|---|---|
| JP | 2010-68604 | 3/2010 |
| JP | 2012-5210 | 1/2012 |
| JP | 2012005210 A * | 1/2012 |

* cited by examiner

ORIGINAL DEMAND DATA (DEMAND CURVE)

FIG. 6B   ⇩ BY SUBTRACTING SAMPLE AVERAGE, AVERAGE IS SET TO 0

FIG. 6C   ⇩ BY DIVIDING SUBTRACTIVE RESULT BY SAMPLE STANDARD DEVIATION, VARIANCE IS SET TO 1

NORMALIZED DEMAND DATA
(DEMAND CURVE)

ESTIMATION PROGRAM, ESTIMATION APPARATUS, AND ESTIMATION METHOD

CROSS-REFERENCE TO RELATED APPLICATION

This application is based upon and claims the benefit of priority of the prior Japanese Patent Application No. 2013-220446, filed on Oct. 23, 2013, the entire contents of which are incorporated herein by reference.

FIELD

A certain aspect of the embodiments is related to a non-transitory computer readable storage medium, an estimation apparatus and an estimation method.

BACKGROUND

In recent years, a distributed power source which represents a solar power generation system spreads in a home. Although the solar power generation system has a merit of being environment-friendly, it also has a demerit of having an adverse influence on the quality of an electric power which an electric power company supplies. Especially, there is a problem that a voltage in a power grid may deviate from a stipulated voltage, by the solar power generation system being introduced to homes (customers) in the power grid. The stipulated voltage means a voltage (i.e., a voltage of the range of 95V to 107V in the case of 100V supply) which the electric power company needs to maintain, and which is defined by Electric Utility Law.

Various methods, such as change of a delivery voltage of a power distribution substation, thickening of an electric wire and revision of a transformer tap, can be considered as a way of controlling a voltage, for example. However, in order to control the voltage, it is necessary to judge which voltage is changed in what manner. On the contrary, there is a method of using sensors installed in the electric wire as a method to know the voltage of the power grid. However, at present, there are very few sensors to the scale of the power grid.

On the other hand, there is known a method called a power flow calculation as a way of calculating a voltage in the power grid and a current value in the power grid. Here, when a voltage distribution needs to be calculated for each predetermined time (for example, 30 minutes), obtaining an absolute value and a phase of the current in each customer or an active power and a reactive power in each customer is required for each predetermined time. However, now, most electric power meters introduced into the customers measure an integral power consumption only once a month and introduction of a smart meter which can measure an electric power value for each predetermined time (for example, 30 minutes) is limited to some customers.

Here, Japanese Laid-open Patent Publication No. 2005-57821 discloses a technique that calculates a load current of each customer from an actual measurement value or standard data generally indicated.

As described above, the actual measurement value of the electric power in the customer is known by only the customer into which the smart meter is introduced. Moreover, even if an electric power value is calculated using the standard data generally indicated, as described in the above-mentioned Japanese Laid-open Patent Publication, the characteristics (for example, the rising of an introductory rate of the solar power generation, etc.) of the customers which change every moment cannot be reflected to the electric power value by such standard data. Therefore, even if the power flow calculation is performed using the electric power value calculated with the use of the above-mentioned standard data, values about the voltage and the current in the power grid cannot be estimated with sufficient accuracy.

SUMMARY

According to an aspect of the present invention, there is provided a non-transitory computer readable storage medium for causing a computer monitoring a power distribution system in which a first customer and a second customer are mixed to execute a process, the process including: acquiring first data measured with a first measurement device installed in the first customer, the first measurement device measuring the first data about an electric power at a first time interval; acquiring second data measured with a second measurement device installed in the second customer, the second measurement device measuring the second data about an electric power at a second time interval longer than the first time interval; estimating data of the first time interval about an electric power of the second customer by using the acquired first data and the acquired second data; and estimating a value about a voltage or a current for each of the first customer and the second customer by using the estimated data of the first time interval and the acquired first data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A to 6C are diagrams explaining processing of step S12 of FIG. 4;

DESCRIPTION OF EMBODIMENTS

<First Embodiment>

Hereinafter, a detailed description will be given of a first embodiment of a power grid system, based on FIGS. 1 to 10.

Figure 1:
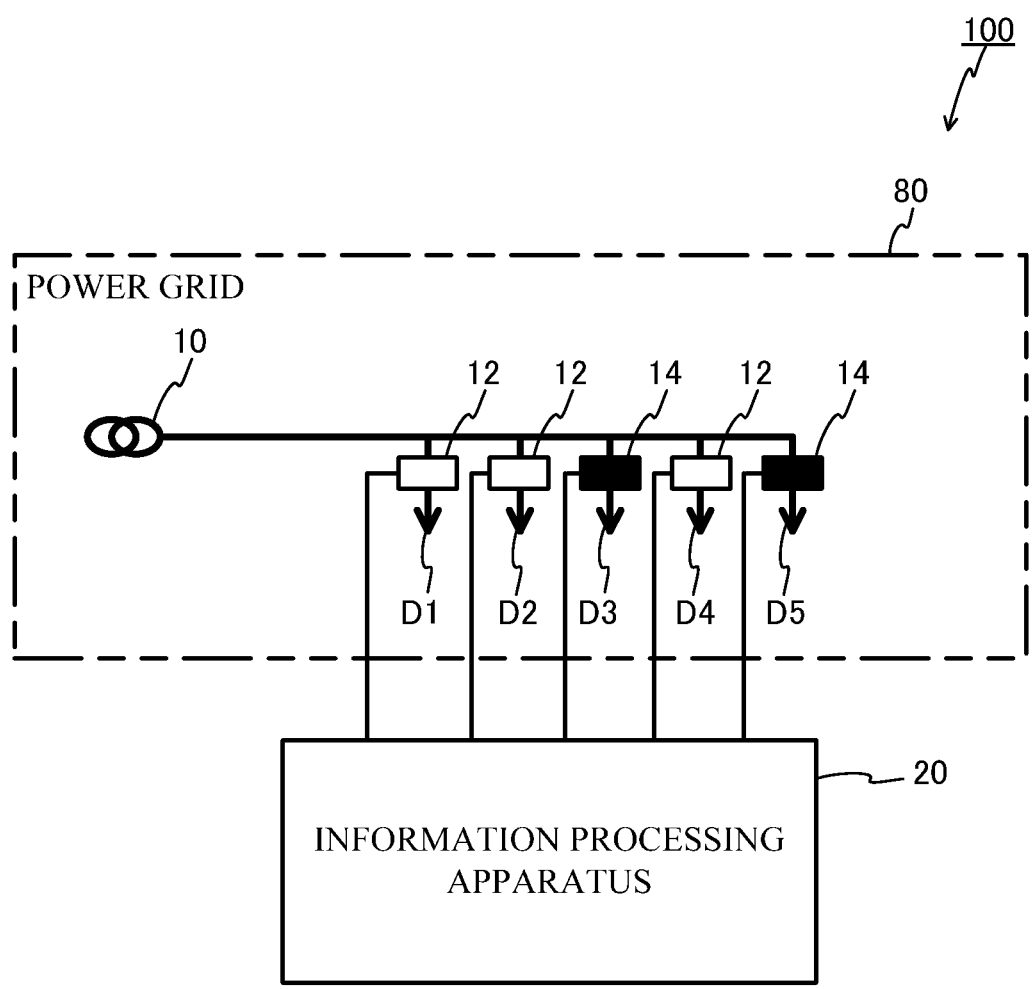
FIG. 1 is a perspective view of the configuration of a power grid system according to a first embodiment.

A power grid system 100 of the first embodiment includes a power grid (a power distribution system) 80 and an information processing apparatus 20, as illustrated in FIG. 1. The pole transformer 10 and five customers D1 to D5 exist in the power grid 80, as one example. In addition, smart meters 12 are installed in the customers D1, D2, and D4 among the customers D1 to D5, and wattmeters (electric power meters) 14 are installed in the customers D3 and D5 among the customers D1 to D5.

The smart meter 12 can acquire a power consumption value (hereinafter simply referred to as "a power value") as first data at a first time interval (e.g. every 30 minutes), and transmits the acquired power value to the information processing apparatus 20. When the smart meter 12 acquires the power value every 30 minutes for one month (for 30 days), for example, it can acquire data of 1440 points (=48 points/1 day×30 days). Here, an integral power consumption for each second time interval (e.g. 1 month) can be calculated from the power values acquired by the smart meter 12.

The wattmeter 14 is a device that can acquire an integral power consumption as second data at the second time interval (e.g. 1 month) longer than the first time interval. The integral power consumption for one month acquired by the wattmeter 14 is inputted to the information processing apparatus 20. Here, in the present embodiment, a measurement result of the wattmeter 14 is automatically inputted to the information processing apparatus 20 by communication. However, an input method of the measurement result is not limited to this, and the measurement result of the wattmeter 14 may be inputted to the information processing apparatus 20 by hand.

Figure 2:
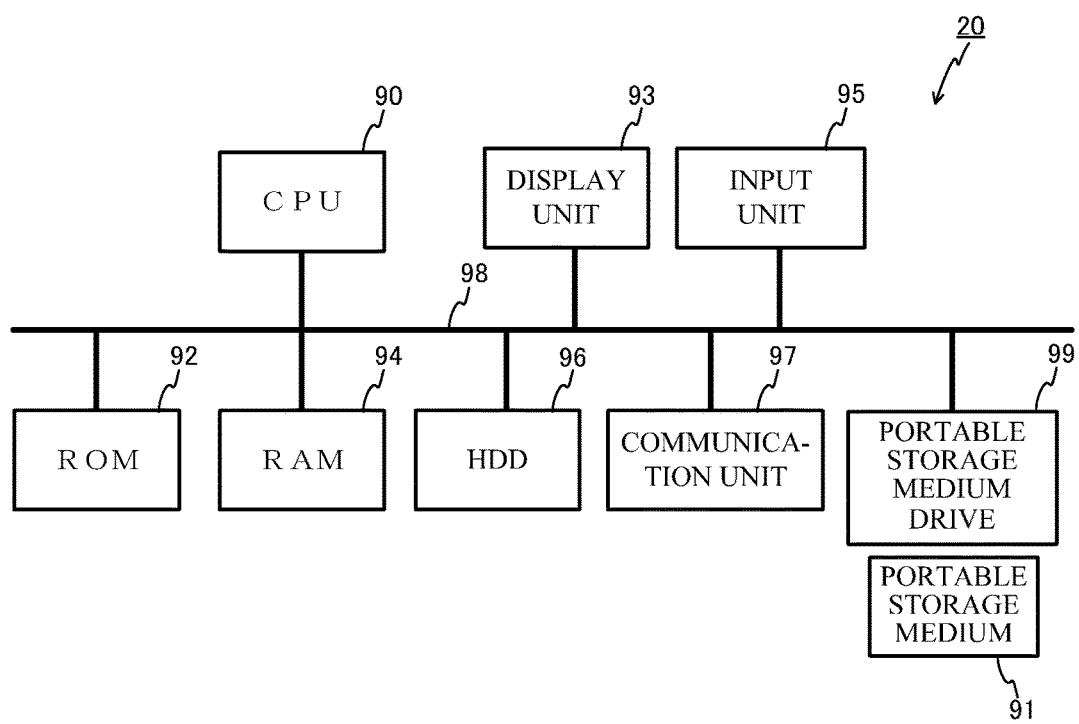
FIG. 2 is a diagram of hardware configuration of an information processing apparatus.
Figure 3:
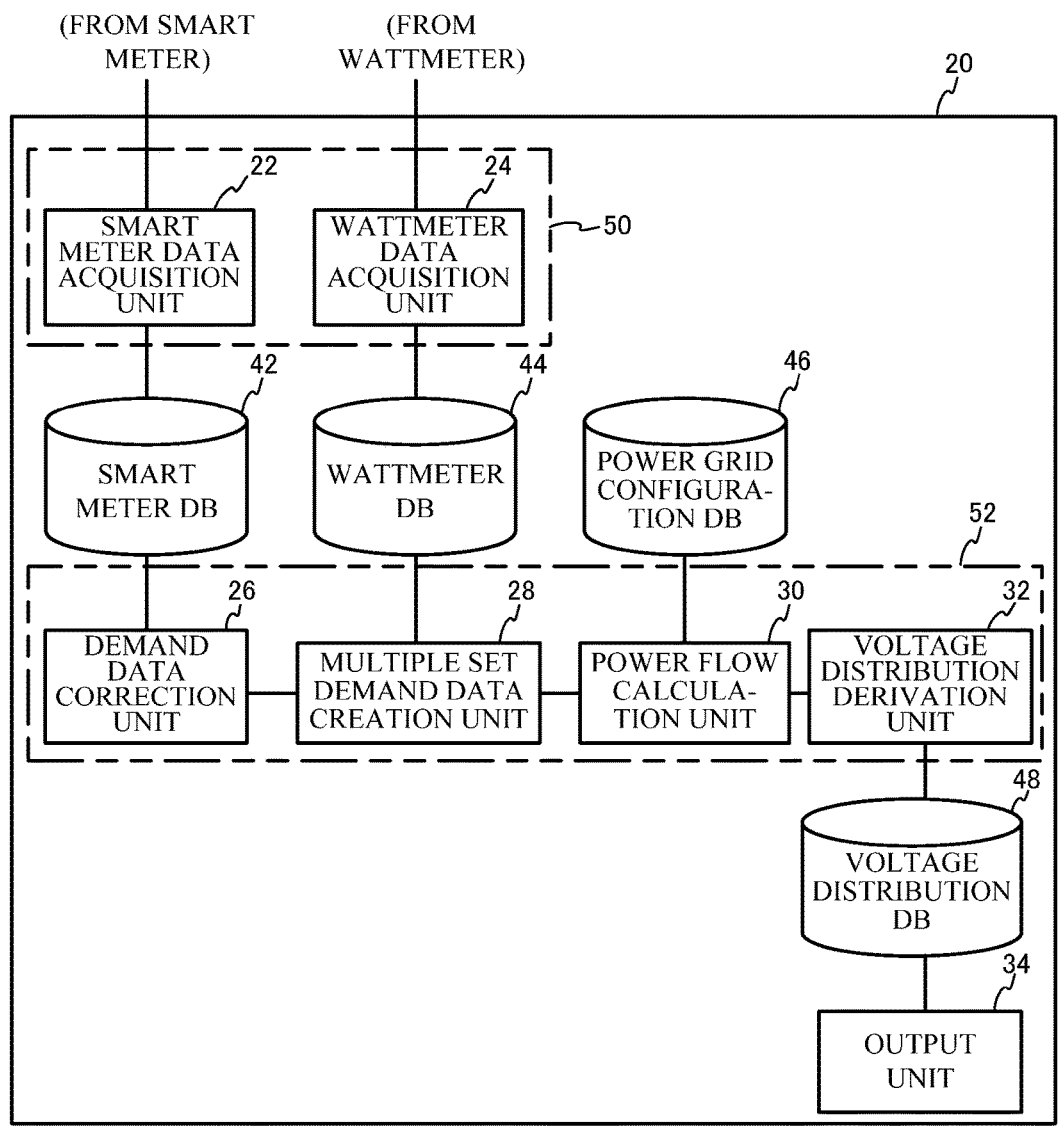
FIG. 3 is a functional block diagram of the information processing apparatus.

The information processing apparatus 20 has hardware configuration as illustrated in FIG. 2. As illustrates in FIG. 2, the information processing apparatus 20 includes a CPU (Central Processing Unit) 90, a ROM (Read Only Memory) 92, a RAM (Random Access Memory) 94, a storage unit (here, HDD (Hard Disk Drive)) 96, a communication unit 97, a display unit 93, an input unit 95 and a portable storage medium drive 99. Each element of the information processing apparatus 20 is connected to a bus 98. The display unit 93 includes a liquid crystal display and the like, and the input unit 95 includes a keyboard and a mouse. Moreover, the communication unit 97 communicates with the smart meter 12 and the wattmeter 14. In the information processing apparatus 20, the CPU 90 executes a program (including an estimation program) stored in the ROM 92 or the HDD 96, or a program (including an estimation program) which the portable storage medium drive 99 reads from a portable storage medium 91, so that functions as an acquisition unit 50, an estimation unit 52 and an output unit 34 are achieved, as illustrated in FIG. 3. In FIG. 3, a smart meter DB 42, a wattmeter DB 44, a power grid configuration DB 46 and a voltage distribution DB 48 which are stored in the HDD 96 or the like are also illustrated.

The acquisition unit 50 includes a smart meter data acquisition unit 22 and a wattmeter data acquisition unit 24.

The smart meter data acquisition unit 22 acquires data of the power values measured at the first time interval (30 minutes) as demand data from the smart meter 12, and stores the data in the smart meter DB 42. Here, the data (time-series data) of the power values every 30 minutes for each customer (D1, D2, D4) is stored in smart meter DB42. In addition, the integral power consumption for each customer for one month calculated from the data of the power value every 30 minutes is also stored in the smart meter DB 42.

The wattmeter data acquisition unit 24 acquires the integral power consumption at the second time interval (e.g. 1 month) from the wattmeter 14, and stores the integral power consumption in the wattmeter DB 44. Here, the integral power consumptions of every month about the customers (D3, D5) are stored in the wattmeter DB44.

The estimation unit 52 includes a demand data correction unit 26 as a first acquisition unit, a multiple set demand data creation unit 28 as a second acquisition unit, a power flow calculation unit 30, and a voltage distribution derivation unit 32. The demand data correction unit 26 normalizes data (it is also called "demand data") of the power values acquired in the smart meters 12 installed in the customers D1, D2, and D4. The demand data correction unit 26 derives a relational expression between the demand data before the normalization, and normalized demand data and the integral power consumption for each customer (D1, D2, D4).

The multiple set demand data creation unit 28 assigns B sets of demand data to all the customers. Note that detailed processing of the multiple set demand data creation unit 28 is described later.

The power flow calculation unit 30 performs the power flow calculation using the B sets of demand data assigned to each customer, and calculates B kinds of voltage values in each time of each customer. In the above-mentioned calculation, the power flow calculation unit 30 refers to the power grid configuration DB 46 storing circuit information in the power grid.

The voltage distribution derivation unit 32 calculates (estimates) a voltage distribution (i.e., a probability distribution of voltage values) in each time of each customer, based on the calculation result of the power flow calculation unit 30, and stores the voltage distribution in the voltage distribution DB 48. Here, the voltage distribution in each time of each customer, acquired as a result of B kinds of the power flow calculation, is stored in the voltage distribution DB 48.

The output unit 34 outputs data stored in the voltage distribution DB 48 by displaying the data on the display unit 93, for example, in response to a request of the user of the information processing apparatus 20. In addition, the output unit 34 outputs the data stored in the voltage distribution DB 48 to a voltage control device, not shown. Thereby, the voltage control device can control a voltage in the power grid. As a result, it is possible to maintain the voltage in the power grid in a stipulated voltage or less.

(Processing of Information Processing Apparatus 20)

Next, a detailed description will be given of processing of the information processing apparatus 20 along with a flowchart of FIG. 4, by reference to other drawings if desired. Here, as a premise of the processing of FIG. 4, the smart meter data acquisition unit 22 and the wattmeter data acquisition unit 24 store the data acquired for one month in the smart meter DB42 and the wattmeter DB44, respectively.

Figure 5:
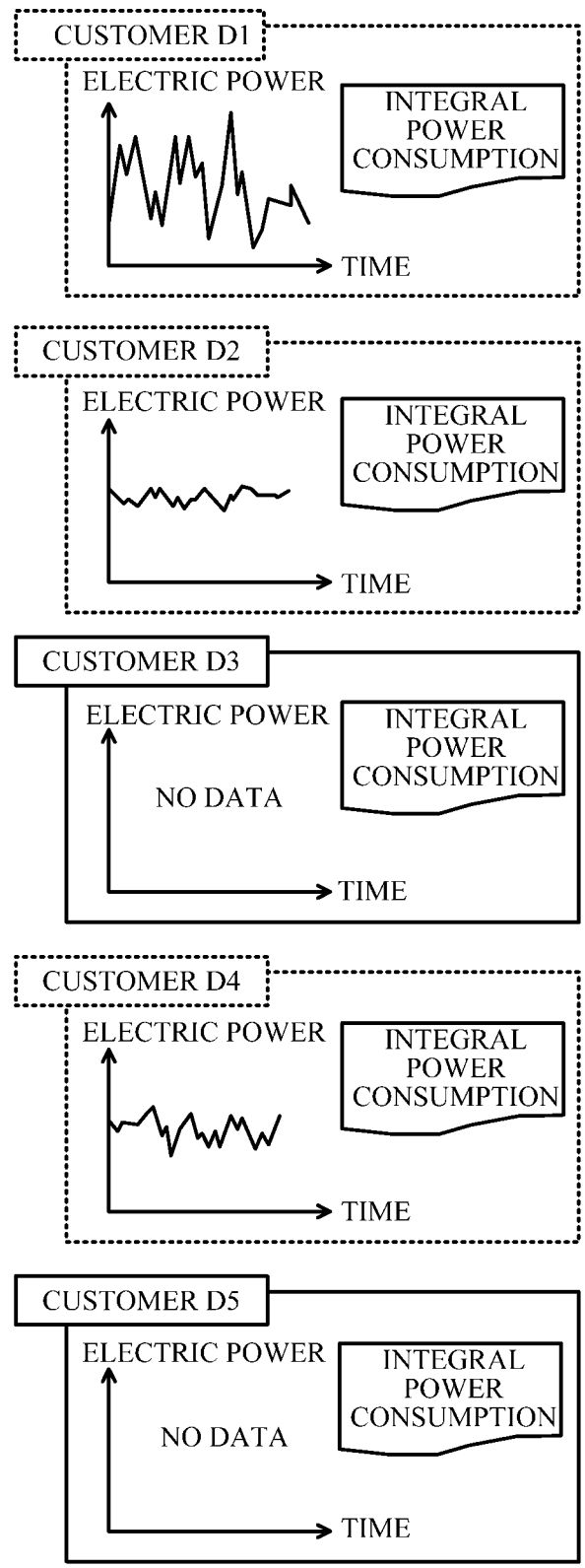
FIG. 5 is a diagram illustrating data acquired by respective customers.

More specifically, the data on the power value of 1440 points (=48 points/1 day x 30) measured every 30 minutes by the smart meter 12 for one month (30 days) and the integral power consumption for one month acquired from the smart meter 12 are stored in the smart meter DB 42 as the demand data about each of the customers D1, D2 and D4, as illustrated in FIG. 5. Note that a part of the 1440 points is illustrated in FIG. 5. In addition, the integral power consumption for one month acquired from the wattmeter 14 is stored in the wattmeter DB44 as the demand data about each of the customers D3 and D5.

Figure 4:
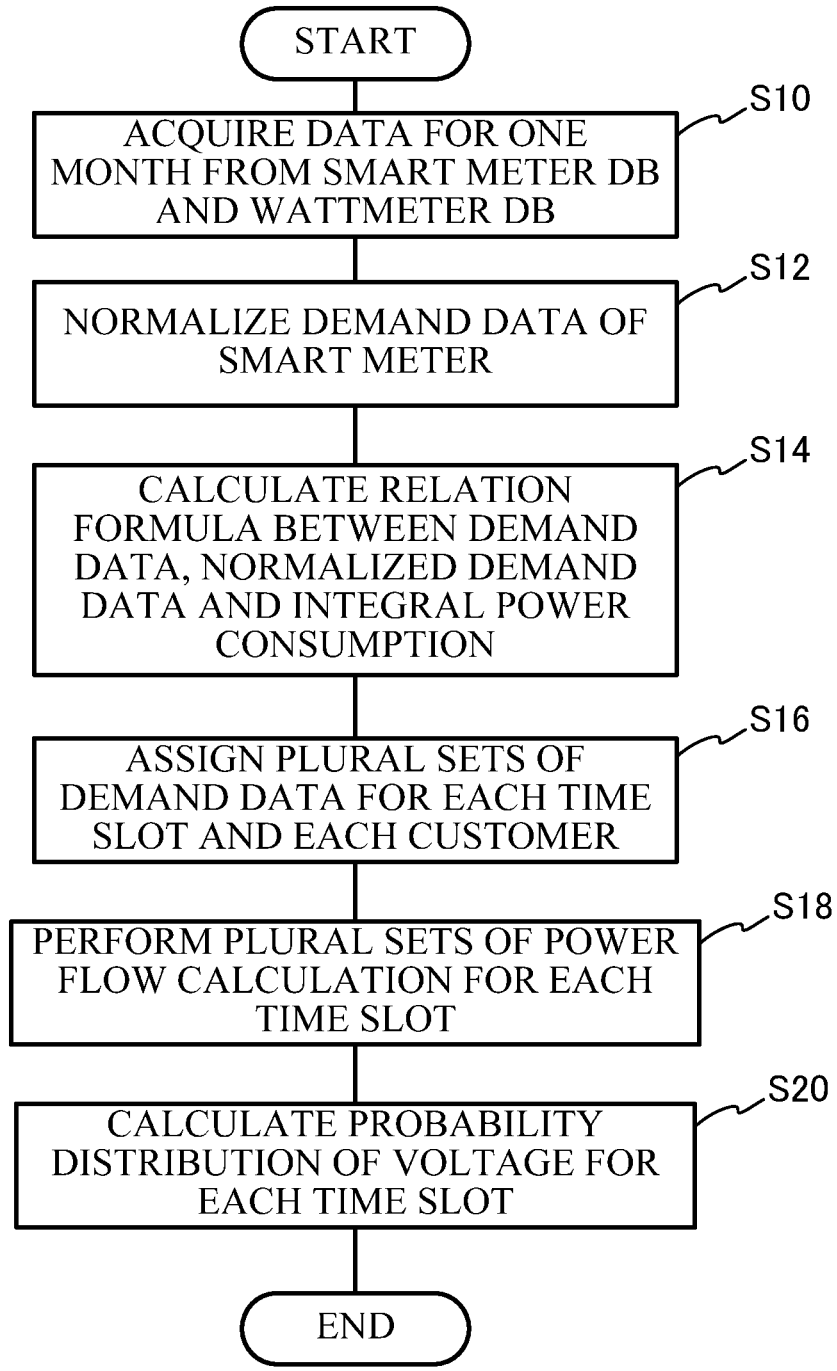
FIG. 4 is a flowchart illustrating processing of the information processing apparatus.

In the processing of FIG. 4, first, the demand data correction unit 26 acquires the data for one month from the smart meter DB 42 and the multiple set demand data creation unit 28 acquires the data of the integral power consumption for one month from the wattmeter DB 44, in step S10. Next, in step S12, the demand data correction unit 26 performs processing which normalizes the demand data acquired from the smart meter DB42.

Specifically, in step S12, the demand data correction unit 26 normalizes the demand data by unifying to 0 an average of the power values of 1440 points about each customer (D1, D2, D4) in which the smart meter 12 is installed, and unifying variance of the power values of 1440 points to 1.

When the demand data about the customer D1 is expressed by "$P_{1\_1}, \ldots, P_{1\_1440}$", and normalized demand data about the customer D1 is expressed by "$P_{1\_1,n}, \ldots, P_{1\_1440,n}$", the demand data correction unit 26 normalizes the demand data by using a following formula (1).

$$P_{1\_i,n} = (P_{1\_1} - P_{1\_mean})/P_{1\_sd} \quad (1)$$

Where the $P_{1\_mean}$ is a sample mean of $P_{1\_1}, \ldots, P_{1\_1440}$, and the $P_{1\_sd}$ is a sample standard deviation of $P_{1\_1}, \ldots, P_{1\_1440}$.

Here, the sample mean $P_{1\_mean}$ is expressed by a following formula (2), and the sample standard deviation $P_{1\_sd}$ is expressed by a following formula (3).

$$P_{1\_mean} = \frac{1}{1440} \sum_{i=1}^{1440} P_{1\_i} \quad (2)$$

$$P_{1\_sd} = \sqrt{\frac{1}{1440} \sum_{i=1}^{1440} (P_{1\_i} - P_{1\_mean})^2} \quad (3)$$

Figure 6A:
Figure 6A:
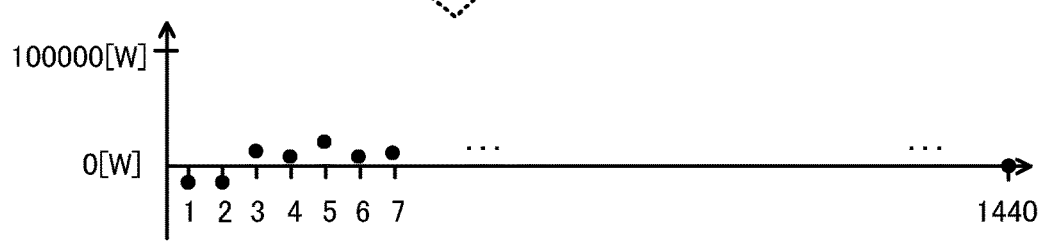
Figure 6A:
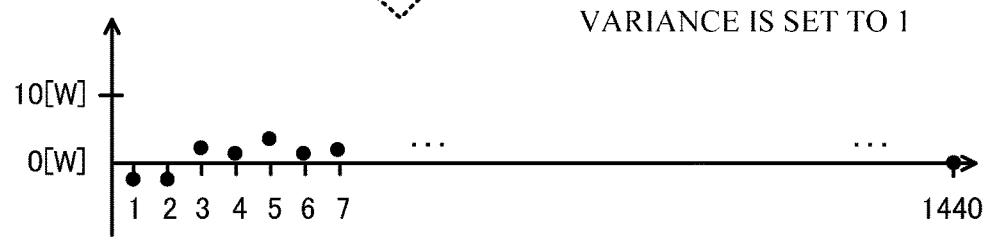

Note that an image of normalization of step S12 is illustrated in the FIGS. 6A to 6C. By subtracting the sample average from the demand data illustrated in FIG. 6A, an average can be set to 0 as illustrated in FIG. 6B. Moreover, by dividing the subtractive result by the sample standard deviation, variance can be set to 0 as illustrated in FIG. 6C.

Returning to FIG. 4, in next step S14, the demand data correction unit 26 performs processing that calculates a relation formula between the demand data, the normalized demand data and the integral power consumption.

In step S14, the demand data correction unit 26 calculates $k_0$ and $k_1$ of a following formula (4) by using the demand data (it is also called a demand curve), the normalized demand data (it is also called a normalized demand curve), the integral power consumption, and a least-squares method.

$$\text{argmin } \Sigma \|\text{DemandCurve} - \text{IntegralPower Consumption} (k_0 + k_1 \times \text{NormalizedDemandCurve})\| \quad (4)$$

Specifically, when the demand data about the customer Dj (j=1, 2, 4) in which the smart meter 12 is installed is expressed by $P_{j\_1}, \ldots, P_{j\_1440}$, the normalized demand data is expressed by $P_{j\_1,n}, \ldots, P_{j\_1440,n}$, and the integral power consumption per one month is expressed by $W_j$, the demand data correction unit 26 calculates $k_0$ and $k_1$ of a following formula (5).

$$\text{argmin} = \sum_{j \in \{1,2,4\}} \sum_{i=1}^{1440} \|P_{j\_i} - W_j(k_0 + k_1 \times P_{j\_i,n})\| \quad (5)$$

Then, the demand data correction unit 26 creates a following formula (6).

Demand Curve≈Integral Power Consumption($k_0 + k_1 \times$ Normalized Demand Curve) (6)

Figure 7:
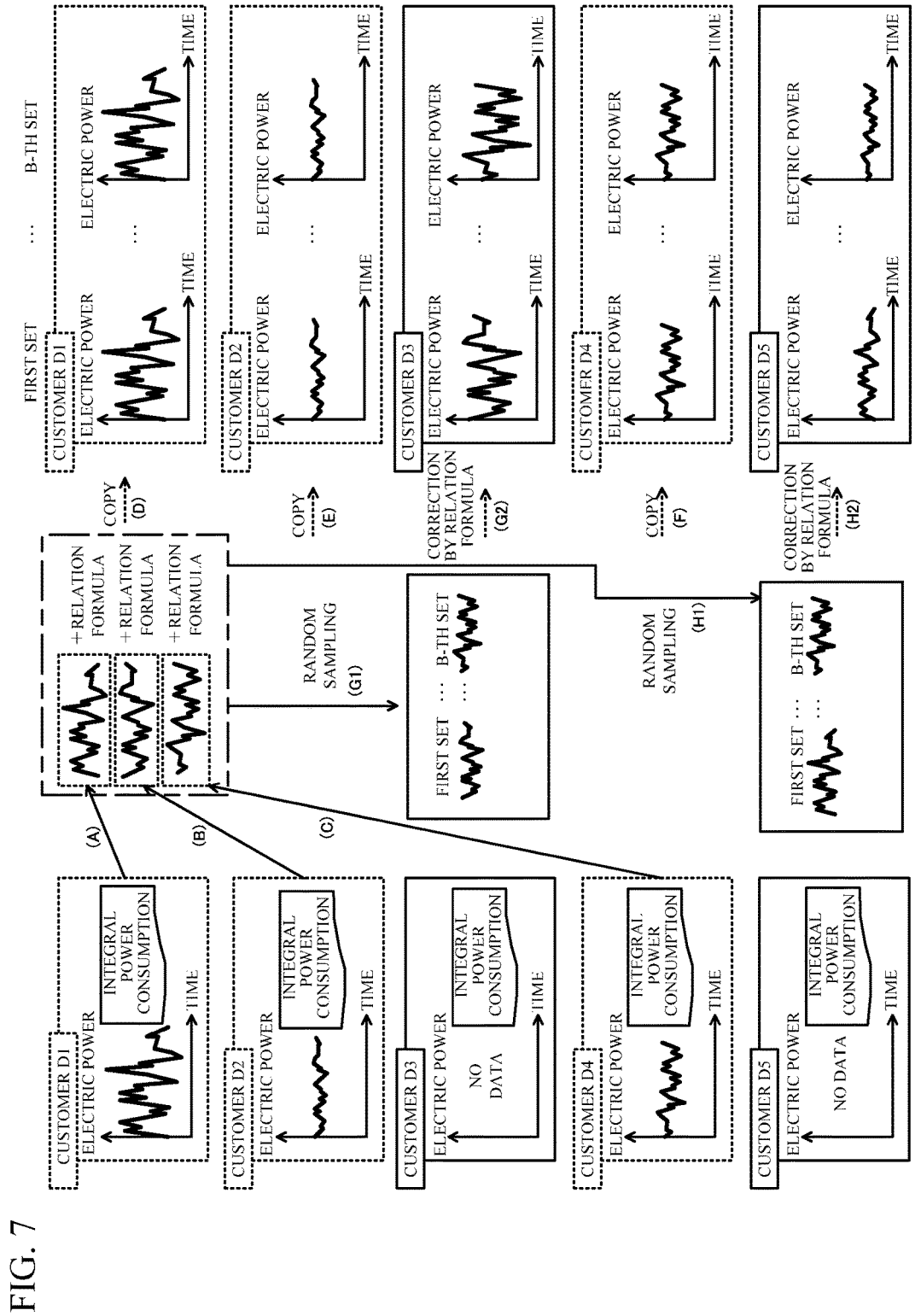
FIG. 7 is a diagram explaining processing of steps S14 and S16 of FIG. 4.

Note that the processing of step S14 described above is processing indicated by marks (A), (B) and (C) in FIG. 7.

Next, in step S16 of FIG. 4, the multiple set demand data creation unit 28 performs processing which assigns a plurality of sets of demand data for each time slot and each customer. In this case, the multiple set demand data creation unit 28 assigns B sets of demand data (i.e., demand curves) each having 1440 points to all the customers. Then, the multiple set demand data creation unit 28 performs the following processing according to whether the smart meter 12 is installed in each customer.

(In the case of the customers D1, D2 and D4 in which the smart meters 12 are installed)

In this case, the multiple set demand data creation unit 28 directly assigns (or copies) the demand data (i.e., the demand curve) of 1440 points measured by the smart meter 12 installed in each corresponding customer as demand data from first set to B-th set about each of the customers D1, D2 and D4. Here, this processing is processing indicated by marks (D), (E) and (F) in FIG. 7.

(In the Case of the Customers D3 and D5 in Which the Smart Meters 12 Are Not Installed)

In this case, the multiple set demand data creation unit 28 randomly selects B sets of normalized demand data (i.e., normalized demand curve) about the customers D1, D2 and D4 in which the smart meters 12 are installed, for each of the customers D3 and D5. The multiple set demand data creation unit 28 assigns demand data (i.e., demand curve) acquired by correcting the selected normalized demand data (i.e., normalized demand curve) using the relation formula (i.e., the formula (6)) calculated in step S14, as demand data (i.e., demand curve) from first set to B-th set of each of the customers D3 and D5. Note that the present processing is processing that estimates data of the first time interval about the electric power of each of the customers D3 and D5. The present proceeding is not limited to a case where the B sets of the normalized demand data (i.e., normalized demand curve) about each of the customers D1, D2 and D4 are selected at random. The multiple set demand data creation unit 28 may select the B sets of the normalized demand data (i.e., normalized demand curve) about each of the customers D1, D2 and D4 in accordance with a prescribed rule.

Figure 8:
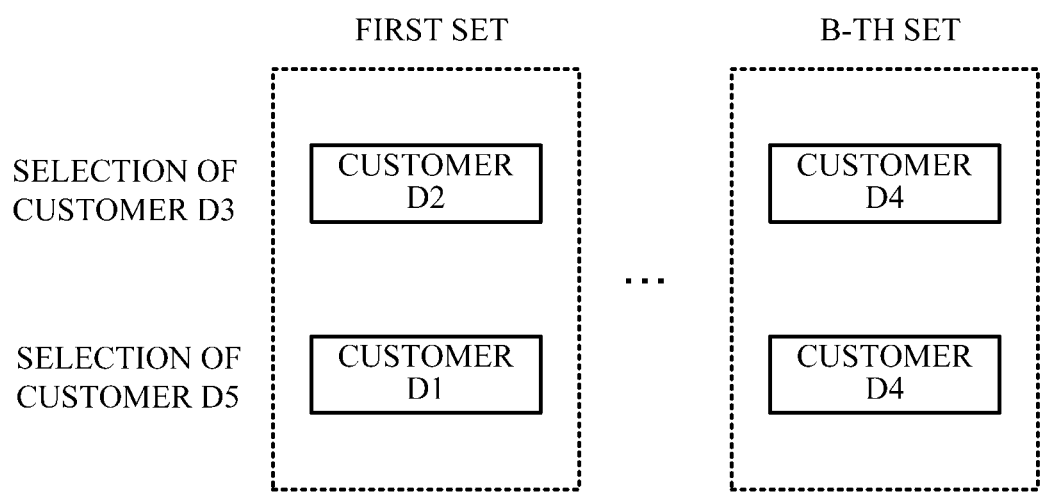
FIG. 8 is a diagram illustrating an example of a result in which a normalized demand curve is selected at random.

It is assumed that a result in which the normalized demand data (i.e., normalized demand curve) are selected at random is illustrated in FIG. 8, for example. As illustrated in FIG. 8, the normalized demand data (i.e., normalized demand curve) about the customer D2 is selected as the first set of the customer D3. Therefore, the multiple set demand data creation unit 28 assigns data acquired by correcting the normalized demand data (i.e., normalized demand curve) $P_{2\_i,n}$ about the customer D2 by a following formula (7), as the first set of the demand data (i.e., demand curve) $P_{3\_i}$ of 1440 points about the customer D3.

$$P_{3\_i} = W_3(k_0 + k_1 \cdot P_{2\_i,n}) \quad (7)$$

Note that the multiple set demand data creation unit 28 assigns the demand data (i.e. demand curve) to the second to the B-th sets about the customer D3 and the first to the B-th sets about the customer D5 in the same manner as mentioned above.

Note that the above-mentioned processing is processing indicated by marks (G1), (G2), (H1) and (H2) in FIG. 7.

Here, the multiple set demand data creation unit 28 transmits a result of the above-mentioned processing to the power flow calculation unit 30.

Next, in step S18 of FIG. 4, the power flow calculation unit 30 performs a plurality of sets (B sets) of power flow calculation for each time slot using the result of the processing received from the multiple set demand data creation unit 28.

Figure 9:
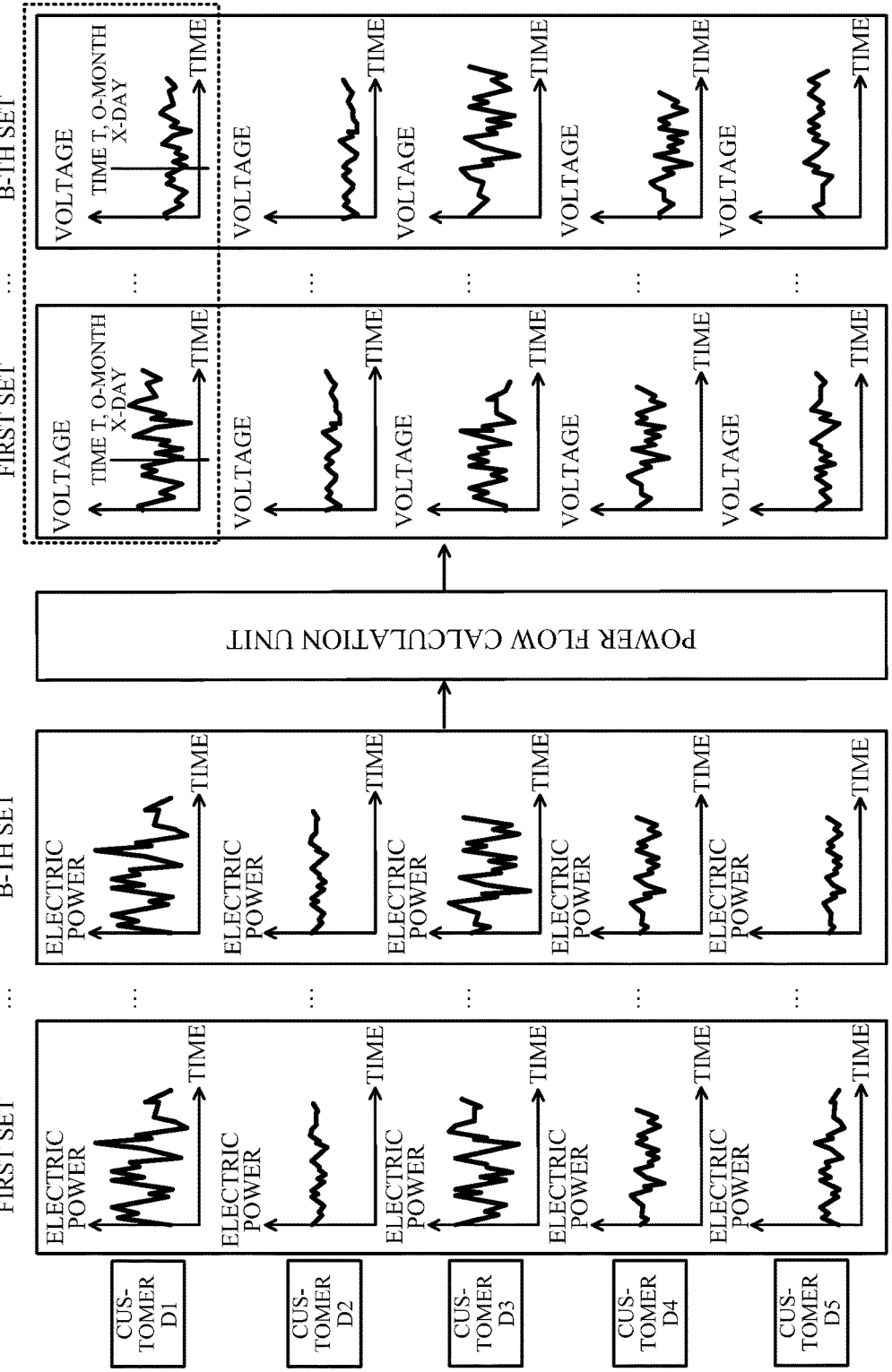
FIG. 9 is a diagram explaining processing of step S18 of FIG. 4.

In this case, since the power flow calculation unit 30 acquires the B sets of electric power data (i.e., power values) about all the customers every 30 minutes (every 1 point), the power flow calculation unit 30 can calculate voltage values of 30 minute intervals about the respective customers by performing the power flow calculation 1440 points x B times. An example of a result of the power flow calculation is indicated by FIG. 9. Here, the power flow calculation unit 30 transmits the result of the power flow calculation to the voltage distribution derivation unit 32.

Next, in step S20 of FIG. 4, the voltage distribution derivation unit 32 calculates a distribution (i.e., a probability distribution) of the voltage for each time slot using the calculation result of the power flow calculation unit 30.

Here, as the calculation result of the power flow calculation unit 30, the B sets of voltage data for each 30 minutes (for each 1 point) about all customers are acquired by the above processing. Therefore, when the voltages (1 to B sets) of first point (i.e., initial time) as a voltage at a certain point are given by $v_1, \ldots, v_B$, the distribution (i.e., the probability distribution) of the voltage is estimated by a normal distribution of $v_{mean}$ which is a sample mean of $v_1, \ldots, v_B$, and $v_{sd}$ which is a sample standard deviation of $v_1, \ldots, v_B$. Here, the $v_{mean}$ and the $v_{sd}$ are expressed by following formulas (8) and (9).

$$V_{mean} = \frac{1}{B}\sum_{i=1}^{B} V_i \qquad (8)$$

$$V_{sd} = \sqrt{\frac{1}{B}\sum_{i=1}^{B}(V_i - V_{mean})^2} \qquad (9)$$

Figure 10:
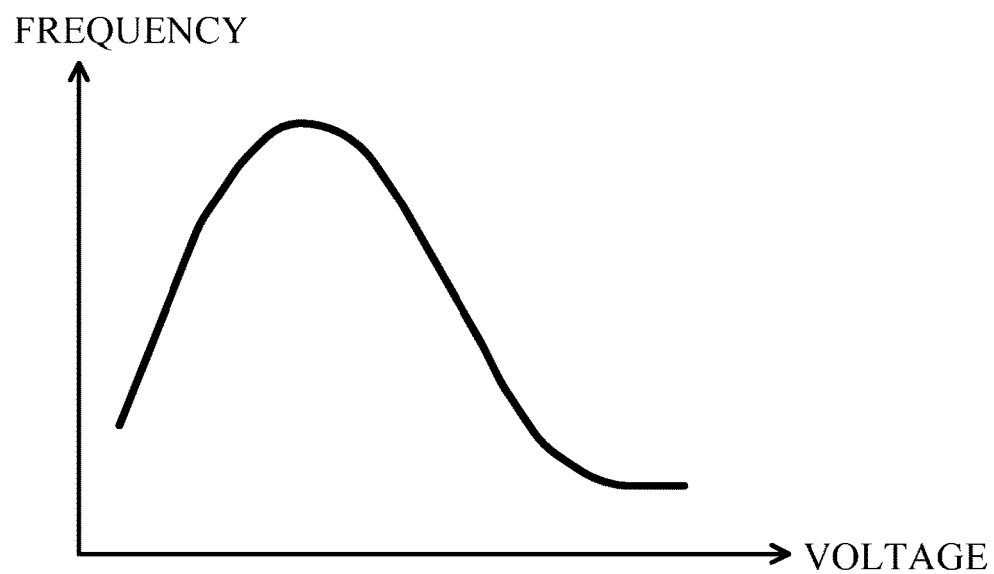
FIG. 10 is a diagram illustrating an example of a voltage distribution acquired as a result of processing of step S20 of FIG. 4.

For example, in case of the distribution of the voltage at a certain time (e.g. time T on o-month/x-day) about the customer D1, the voltage values of the first to B-th sets at the certain time (e.g. time T on o-month/x-day) about the customer D1 illustrated by a broken line frame of FIG. 9 are extracted, and the extracted result can be expressed as illustrated in FIG. 10 by setting a voltage to a horizontal axis and setting a frequency to a vertical axis.

Thus, after the processing of FIG. 4 is completed, the output unit 34 outputs the data stored in the voltage distribution DB 48 to a voltage control device, not shown, for example. In this case, the voltage control device control a voltage in the power grid using the inputted data, so that the voltage in the power grid can be maintained in a stipulated voltage or less. Alternatively, the output unit 34 displays the data stored in the voltage distribution DB 48 on the display unit 93 according to a request from a user.

As can be seen from the description mentioned above, the demand data correction unit 26 and the multiple set demand data creation unit 28 realize a function as a first estimation unit that estimates the demand data of the customer in which the smart meter is not installed. In addition, the power flow calculation unit 30 and the voltage distribution derivation unit 32 realize a function as a second estimation unit that estimates the voltage distribution in the power grid 80 for each customer.

As described above, according to the first embodiment, the demand data correction unit 26 acquires the demand data measured by the smart meter 12, and the multiple set demand data creation unit 28 acquires the data of the integral power consumption measured by the wattmeter 14. Then, the demand data correction unit 26 and the multiple set demand data creation unit 28 estimate the demand data of each of the customers (D3 and D5) in which the smart meter 12 is not installed (i.e., data of the first time interval about the power value of each of the customers (D3 and D5)) by using the demand data measured by the smart meters 12 installed in the customers (D1, D2 and D4) and the data of the integral power consumption measured by the wattmeters 14 installed in the customers (D3 and D5) (S12 to S16). And then, the power flow calculation unit 30 and the voltage distribution derivation unit 32 calculate (estimate) the voltage distribution for each customer by using the estimated demand data of the customers (D3 and D5) and the measured demand data of the customers (D1, D2 and D4). Thus, in the present embodiment, the demand data of the customers (D3 and D5) in which the smart meters 12 are not installed are estimated from an own integral power consumption and the demand data of other customers (D1, D2 and D4) in the power grid 80. Therefore, the demand data of each customer, which has reflected the characteristics (for example, the rising of an introductory rate of the solar power generation, etc.) of the customers in the power grid 80, can be estimated with high accuracy. Moreover, the voltage distribution for each customer can be estimated with high accuracy by using the demand data of each customer estimated with high accuracy.

In the first embodiment, in step S16, the multiple set demand data creation unit 28 selects the B sets of the normalized demand data about each of the customers (D1, D2 and D4) at random, and calculates the B sets of the demand data about each of the customers (D3 and D5) by using the selected normalized demand data. Then, the power flow calculation unit 30 performs the power flow calculation with the use of the B sets of the demand data, and the voltage distribution derivation unit 32 calculates (estimates) the voltage distribution about each of the customers (D1 to D5) with the use of a result of the power flow calculation. Therefore, in the present embodiment, the voltage distribution about each of the customers can be estimated with high accuracy by using the B sets of the demand data about the customers (D3 and D5) estimated with the use of the normalized demand data about the customers (D1, D2 and D4).

<Second Embodiment>

Next, a detailed description will be given of a power grid system according to a second embodiment, based on FIGS. 11 and 12.

Figure 11:
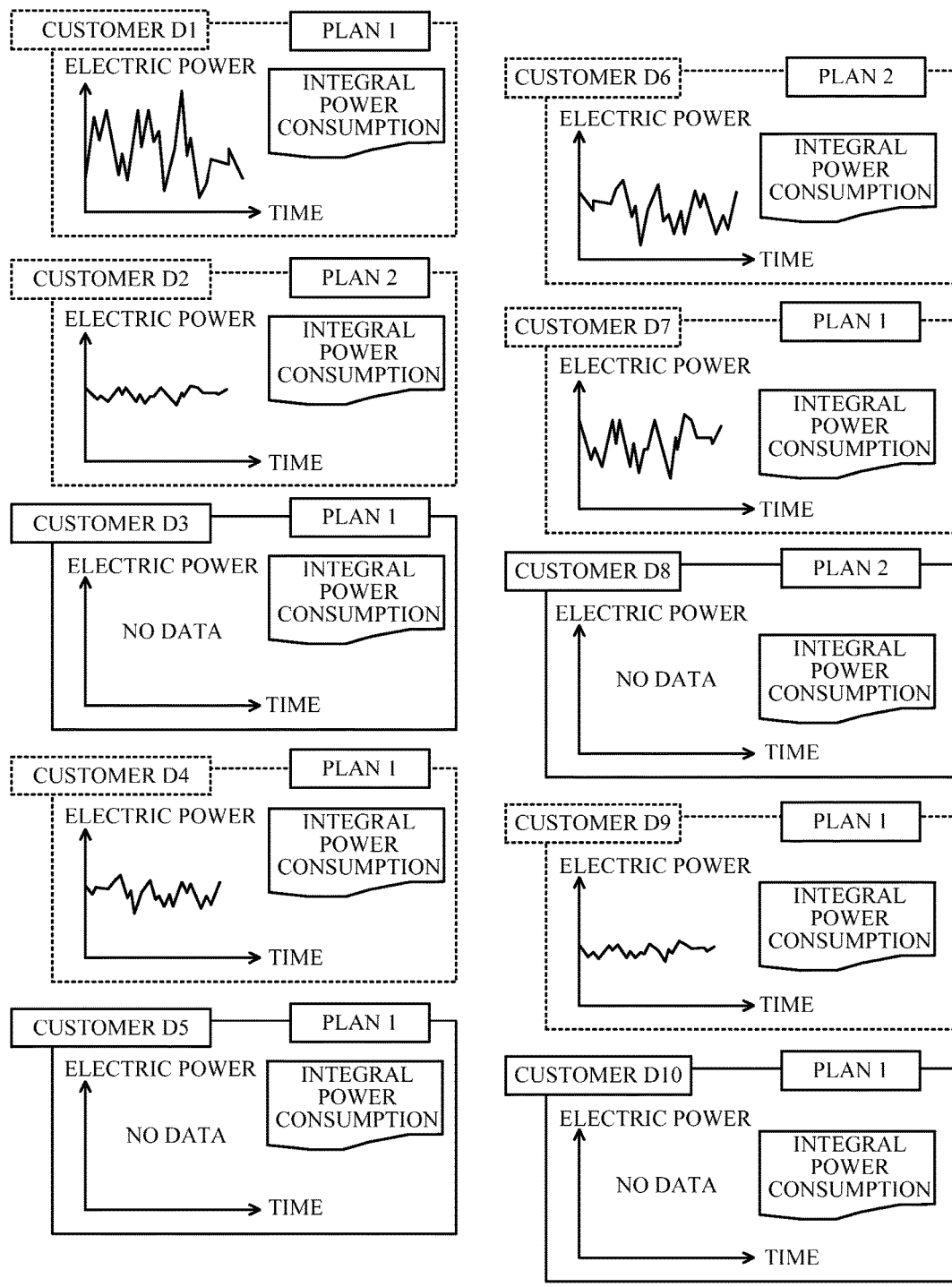
FIG. 11 is a diagram illustrating data acquired by the respective customers and contract plans of the respective customers with respect to a second embodiment.

In the second embodiment, 10 customers exists in the power grid as illustrated in FIG. 11, as one example. In addition, smart meters 12 are installed in customers D1, D2, D6, D7 and D9 among these customers, and wattmeters 14 are installed in remaining four customers D3, D5, D8 and D10. In addition, contract plans about all the customers are understood. A contract plan 1 is a normal plan of electricity charges, and the customers D1, D3, D4, D5, D7, D9 and D10 contract the contract plan 1. A contract plan 2 is a plan having expensive electricity charges for daytime and inexpensive electricity charges for night, and the customers D2, D6 and D8 contract the contract plan 2.

Here, since the device configuration of the second embodiment is the same as that of the first embodiment except for the member of the above-mentioned customers, a detailed description thereof is omitted.

(As to Processing of Information Processing Apparatus 20)

Also in the second embodiment, the information processing apparatus 20 basically performs the processing of FIG. 4, but the processing of steps S14 and S16 differs from corresponding processing of the above-mentioned first embodiment. Therefore, hereinafter, a detailed description will be given of the processing of steps S14 and S16.

(As to Step S14)

In step S14, the demand data correction unit 26 performs processing that calculates a relation formula between the demand data, the normalized demand data and the integral power consumption.

In this case, the demand data correction unit 26 solves $k_{0\_plan\#m}$ and $k_{1\_plan\#m}$ (m=1, 2) of a following formula (10) by using a least squares method for each of the contract plans 1 and 2.

$$\arg\min \Sigma \|\text{Demand Curve of Contract Plan } m - \text{Integral Power Consumption}(k_{0\_plan\#m} + k_{1\_plan\#m} \times \text{Normalized Demand Curve of Contract Plan } m)\| \quad (10)$$

Then, the demand data correction unit 26 creates a relation formula (m=1, 2) of a following formula (11).

$$\text{Demand Curve of Contract Plan } m \approx \text{Integral Power Consumption}(k_{0\_plan\#m} + k_{1\_plan\#m} \times \text{Normalized Demand Curve of Contract Plan } m) \quad (11)$$

Specifically, when the demand data in the contract plan 1 about a customer $D_j$ (j=1, 4, 7, and 9) in which the smart meter 12 is installed is expressed by "$P_{j\_1}, \ldots, P_{j\_1440}$", normalized demand data thereof is expressed by "$P_{j\_1,n}, \ldots, P_{j\_1440,n}$", and the integral power consumption for one month is expressed by "$W_j$", the demand data correction unit 26 solves $k_{0\_plan\#1}$ and $k_{1\_plan\#1}$ of a following formula (12).

$$\arg\min = \sum_{j \in \{1,4,7,9\}} \sum_{i=1}^{1440} \|P_{j\_i} - W_j(k_{0\_plan\#1} + k_{1\_plan\#1} \times P_{j\_i,n})\| \quad (12)$$

Similarly, when the demand data in the contract plan 2 about a customer $D_j$ (j=2 and 6) in which the smart meter 12 is installed is expressed by "$P_{j\_1}, \ldots, P_{j\_1440}$", normalized demand data thereof is expressed by "$P_{j\_1,n}, \ldots, P_{j\_1440,n}$", and the integral power consumption for one month is expressed by "$W_j$", the demand data correction unit 26 solves $k_{0\_plan\#2}$ and $k_{1\_plan\#2}$ of a following formula (13).

$$\arg\min = \sum_{j \in \{2,6\}} \sum_{i=1}^{1440} \|P_{j\_i} - W_j(k_{0\_plan\#2} + k_{1\_plan\#2} \times P_{j\_i,n})\| \quad (13)$$

As a result, with respect to the contract plan 1, a relation formula indicated by a following formula (14) is created.

$$\text{Demand Curve} \approx \text{Integral Power Consumption}(k_{0\_plan\#1} + k_{1\_plan\#1} \times \text{Normalized Demand Curve}) \quad (14)$$

With respect to the contract plan 2, a relation formula indicated by a following formula (15) is created.

$$\text{Demand Curve} \approx \text{Integral Power Consumption}(k_{0\_plan\#2} + k_{1\_plan\#2} \times \text{Normalized Demand Curve}) \quad (15)$$

(As to Step S16)

In step S16, the multiple set demand data creation unit 28 performs processing which assigns a plurality of sets of demand data for each time slot and each customer.

In this case, the multiple set demand data creation unit 28 assigns the B sets of demand data each having 1440 points to all the customers. Then, the multiple set demand data creation unit 28 performs the following processing according to whether the smart meter 12 is installed in each customer.

(In the Case of the Customers D1, D2, D4, D6, D7 and D9 in Which the Smart Meters 12 are Installed)

In this case, the multiple set demand data creation unit 28 directly assigns (or copies) the demand data (i.e., the demand curve) of 1440 points measured by the smart meter 12 installed in each corresponding customer as demand data from first set to B-th set about each of the customers D1, D2, D4, D6, D7 and D9.

(In the Case of the Customers D3, D5, D8 and D10 in Which the Smart Meters 12 are Not Installed)

In this case, the multiple set demand data creation unit 28 randomly selects B sets of normalized demand data about the customers in the same contract plan in which the smart meters 12 are installed, for each of the customers D3 D5, D8 and D10. Then, the multiple set demand data creation unit 28 selects the selected normalized demand data (i.e., normalized demand curve), and then corrects the demand data with the use of the relation formula.

Figure 12:
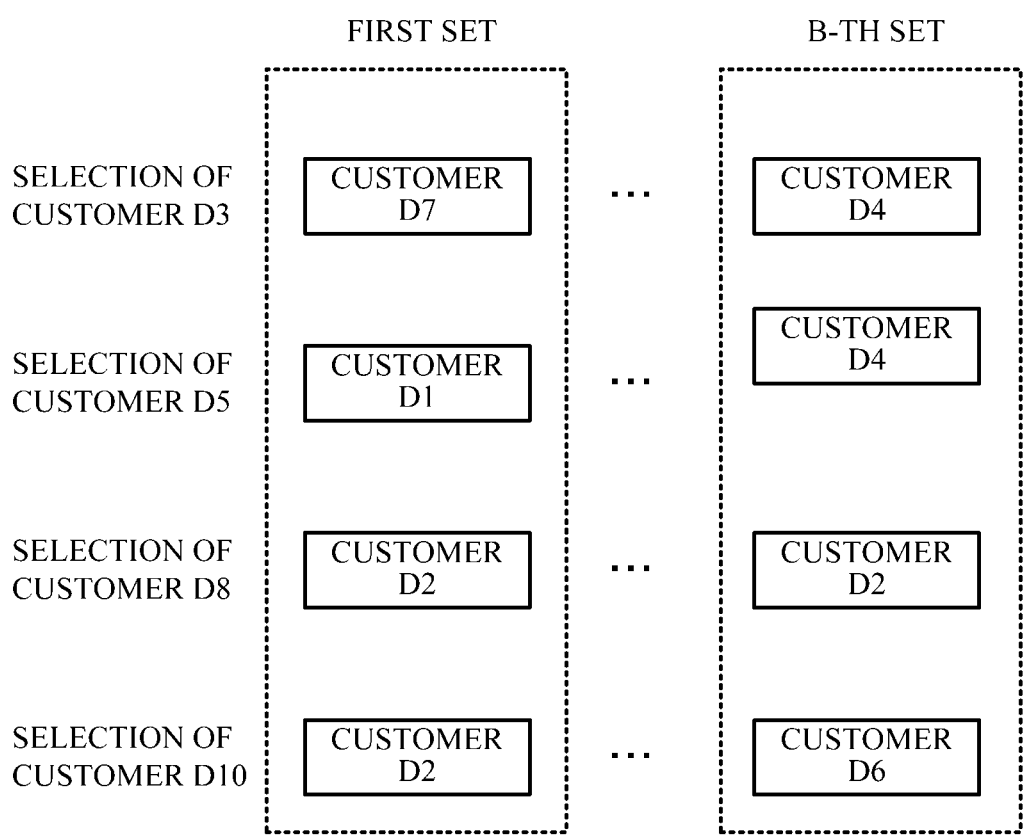
FIG. 12 is a diagram illustrating an example of a result in which a normalized demand curve is selected at random, with respect to the second embodiment.

It is assumed that a result in which the normalized demand data are selected at random is illustrated in FIG. 12, for example. In this case, the normalized demand data about the customer D7 is assigned as the first set of the customer D3 having the contract plan 1. Therefore, the first set of the demand data (i.e., demand curve) of 1440 points about the customer D3 is calculated from the normalized demand data (i.e., normalized demand curve) about the customer D7 according to a following formula (16).

$$P_{3\_i} = W_3(k_{0\_plan\#1} + k_{1\_plan\#1} \times P_{7\_i,n}) \quad (16)$$

According to FIG. 12, the normalized demand data about the customer D2 is assigned as the first set of the customer D8 having the contract plan 2. Therefore, the first set of the demand data (i.e., demand curve) of 1440 points about the customer D8 is calculated from the normalized demand data (i.e., normalized demand curve) about the customer D2 according to a following formula (17).

$$P_{8\_i} = W_8(k_{0\_plan\#2} + k_{1\_plan\#2} \times P_{2\_i,n}) \quad (17)$$

Here, other processing of FIG. 4 is the same as the corresponding processing of the first embodiment.

As described above, according to the second embodiment, in step S14, the demand data correction unit 26 calculates the relation formula (formula (14) or (15)) for every contract plan. Then, in step S16, when the multiple set demand data creation unit 28 calculates the B sets of demand data about the customers in which the smart meters 12 are not installed, the multiple set demand data creation unit 28 randomly assigns the B sets of demand data about the customers, in which the smart meters 12 are installed, which have the common contract plans with the customers in which the smart meters 12 are not installed, and corrects the assigned demand data by using the relation formula calculated for every contract plan. Thus, when the B sets of demand data about the customers in which the smart meters 12 are not installed are calculated, it is possible to more accurately calculate the B sets of demand data about the customers in which the smart meters 12 are not installed, by using the demand data about the customers having a common characteristic. Moreover, the voltage distribution of each customer is calculated using the demand data calculated in this way, and hence the voltage distribution of each customer can be calculated more accurately.

Here, the above-mentioned second embodiment explains about the case where the customers are grouped according to the contract plan, but a grouping of the customers is not limited to this. For example, the grouping may be performed based on the integral power consumption for each customer, information indicating whether a solar power generation apparatus is installed in the customer, or information indicating whether the customer is an apartment or a solitary house, or the like.

Here, the above-mentioned first and second embodiments conclusively explain about the case where the voltage distribution of each customer in each time is calculated, but a calculation object is not limited to this. For example, a value about a current of each customer in each time may be calculated Here, the above-mentioned first and second embodiments explain about the case where the smart meter data acquisition unit 22 acquires the value of the power consumption about the customer from the smart meter 12, but an acquisition object is not limited to this. For example, the smart meter data acquisition unit 22 may acquire values of a current and an electric power amount from the smart meter 12. Moreover, the above-mentioned first and second embodiments explain about the case where the wattmeter data acquisition unit 24 acquires the value of the electric power amount (the integral power consumption) about the customer from the wattmeter 14, but an acquisition object is not limited to this. For example, the wattmeter data acquisition unit 24 may acquire values of a current and an electric power from the wattmeter 14.

In addition, the above-described processing functions may be achieved by a computer. In this case, a program is provided in which processing contents of functions that the processor needs to have are described. By executing the program on the computer, the above-described processing functions are achieved on the computer. The program in which processing contents are described may be stored in a non-transitory computer-readable recording medium (here, a carrier wave is excepted).

In the case of distributing the program, portable recording media, such as DVDs (Digital Versatile Disk) and CD-ROMs (Compact Disc Read Only Memory), in which the program is stored are sold. In addition, the program may be stored in a memory device of a server computer and then transferred from the server computer to another computer via a network.

A computer for executing the program stores the program, which is originally stored in a portable recording medium or transferred from the server computer, in its own memory device. Subsequently, the computer reads the program from its own memory device and performs processing according to the program. Note that the computer is able to read the program directly from the portable recording medium and perform processing according to the program. In addition, the computer is able to perform processing according to sequentially received programs each time the programs are transferred from the server computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer readable storage medium for causing a computer monitoring a power distribution system in which information of first customers and a second customer are mixed to execute a process, the process comprising:

acquiring first data including first power consumption values measured with a first measurement device installed in association with each of the first customers, the first measurement device measuring the first power consumption values;

acquiring second data including an integral power consumption measured with a second measurement device installed in association with the second customer, the second measurement device measuring the integral power consumption;

normalizing the acquired first data of each of the first customers;

selecting n sets of normalized first data where n is two or greater;

estimating n sets of third data each including second power consumption values every first time interval for the second customer by using selected n sets of the normalized first data and the acquired second data;

estimating n sets of fourth data each including voltage values or current values every first time interval for each of the first customers and the second customer by using the n sets of third data and the acquired first data;

obtaining a frequency distribution of a voltage value or a current value at each time for each of the first customers and the second customer by using the n sets of fourth data for each of the first customers and the second customer; and outputting the obtained frequency distribution of the voltage value or the current value at each time for each of the first customers and the second customer to a voltage control device that controls a voltage in a power grid based on the obtained frequency distribution to maintain the voltage in the power grid in a stipulated voltage or less.

2. The non-transitory computer readable storage medium as claimed in claim 1, wherein when the n sets of normalized first data are selected, the estimating the n sets of third data includes selecting the n sets plurality of normalized first data from all the normalized first data corresponding to the first customer having a common characteristic with the second customer.

3. An estimation apparatus monitoring a power distribution system in which information of first customers and a second customer are mixed, the estimation apparatus comprising:

a memory; and a processor coupled to the memory and configured to:

acquire first data including first power consumption values measured with a first measurement device installed in association with each of the first customers, the first measurement device measuring the first power consumption values at a first time interval, acquire second data including an integral power consumption measured with a second measurement device installed in association with the second customer, the second measurement device measuring the integral power consumption at a second time interval longer than the first time interval, normalize the acquired first data of each of the first customers, select n sets of normalized first data where n is two or greater, and estimate n sets of third data each including second power consumption values every first time interval for the second customer by using selected n sets of normalized first data and the acquired second data, estimate n sets of fourth data each including voltage values or current values every first time interval for each of the first customers and the second customer by using the n sets of third data and the acquired first data;

obtain frequency distribution of a voltage value or a current value at each time for each of the first customers and the second customer by using the n sets of fourth data for each of the first customers and the second customer, and output the obtained frequency distribution of the voltage value or the current value at each time for each of the first customers and the second customer to a voltage control device that controls a voltage in a power grid based on the obtained frequency distribution to maintain the voltage in the power grid in a stipulated voltage or less.

4. The estimation apparatus as claimed in claim 3, wherein when the n sets of normalized first data are selected, the processor is configured to select the n sets of normalized first data from all the normalized first data corresponding to the first customer having a common characteristic with the second customer.

5. An estimation method for causing a computer monitoring a power distribution system in which information of first customers and a second customer are mixed to execute a process, the process comprising:

acquiring first data including first power consumption values measured with a first measurement device installed in association with each of the first customers, the first measurement device measuring the first power consumption values at a first time interval;

acquiring second data including an integral power consumption measured with a second measurement device installed in association with the second customer, the second measurement device measuring the integral power consumption at a second time interval longer than the first time interval;

normalizing the acquired first data of each of the first customers;

selecting n sets of normalized first data where n is two or greater;

estimating n sets of third data each including second power consumption values every first time interval for the second customer by using selected n sets of normalized first data and the acquired second data, estimating n sets of fourth data each including voltage values or current values every first time interval for each of the first customers and the second customer by using the n sets of third data and the acquired first data;

obtaining frequency distribution of a voltage value or a current value at each time for each of the first customers and the second customer by using the n sets of fourth data for each of the first customers and the second customer; and outputting the obtained frequency estimated probability distribution of the voltage value or the current value at each time for each of the first customers and the second customer to a voltage control device that controls a voltage in a power grid based on the obtained frequency distribution to maintain the voltage in the power grid in a stipulated voltage or less.

6. The estimation method as claimed in claim 5, wherein when the n sets of normalized first data are selected, the estimating the n sets of third data includes selecting the n sets of normalized first data from all the normalized first data corresponding to the first customer having a common characteristic with the second customer.

* * * * *